(12) United States Patent
Saito et al.

(10) Patent No.: US 8,975,347 B2
(45) Date of Patent: Mar. 10, 2015

(54) METHOD FOR MANUFACTURING ELECTRONIC COMPONENT

(75) Inventors: Takeshi Saito, Shibukawa (JP); Tomomichi Takatsu, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 77 days.

(21) Appl. No.: 13/820,871

(22) PCT Filed: Sep. 14, 2011

(86) PCT No.: PCT/JP2011/070959
§ 371 (c)(1),
(2), (4) Date: Mar. 5, 2013

(87) PCT Pub. No.: WO2012/049938
PCT Pub. Date: Apr. 19, 2012

(65) Prior Publication Data
US 2013/0171804 A1    Jul. 4, 2013

(30) Foreign Application Priority Data

Oct. 14, 2010  (JP) ................................ 2010-231124

(51) Int. Cl.
| | | |
|---|---|---|
| *C08F 283/00* | (2006.01) | |
| *C09J 11/06* | (2006.01) | |
| *C09D 133/06* | (2006.01) | |
| *H01L 21/67* | (2006.01) | |
| *C08G 18/67* | (2006.01) | |
| *C08G 18/79* | (2006.01) | |
| *C08G 18/81* | (2006.01) | |
| *C09J 175/16* | (2006.01) | |
| *H01L 21/78* | (2006.01) | |
| *C09J 143/04* | (2006.01) | |
| *C08F 283/12* | (2006.01) | |

(52) U.S. Cl.
CPC .............. *C09J 11/06* (2013.01); *C09D 133/066* (2013.01); *H01L 21/67132* (2013.01); *C08G 18/673* (2013.01); *C08G 18/792* (2013.01); *C08G 18/8175* (2013.01); *C09J 175/16* (2013.01); *H01L 21/78* (2013.01); *C09J 143/04* (2013.01)

USPC ............ 525/477; 525/389; 525/478; 428/76; 428/131; 428/142; 428/343; 428/345; 428/355; 428/361; 428/500; 156/247; 156/250

(58) Field of Classification Search
USPC ........... 428/76, 131, 142, 343, 345, 355, 361, 428/500; 156/250, 247; 525/389, 478
See application file for complete search history.

(56) References Cited

U.S. PATENT DOCUMENTS

2006/0188725 A1    8/2006  Yoshida et al.
2006/0204749 A1    9/2006  Kita et al.

FOREIGN PATENT DOCUMENTS

| JP | 2006-049509 A | 2/2006 |
|---|---|---|
| JP | 2006-264296 A | 10/2006 |
| JP | 2007-246633 A | 9/2007 |
| JP | 2008-1817 A | 1/2008 |
| JP | 2009-141009 A | 6/2009 |
| JP | 2010-219293 A | 9/2010 |
| WO | 2010-047272 A1 | 4/2010 |

OTHER PUBLICATIONS

International Search Report of PCT/JP2011/070959 mailed on Nov. 22, 2011.
U.S. Appl. No. 13/825,673, filed Mar. 22, 2013.

*Primary Examiner* — Terressa Boykin
(74) *Attorney, Agent, or Firm* — Roberts Mlotkowski Safran & Cole P.C.

(57) ABSTRACT

Provided is a method for manufacturing electronic component improved in chip-holding efficiency, pickup efficiency and contamination resistance in a well-balanced manner, the method comprising a semi-cured adhesive layer-forming step of forming a semi-cured adhesive layer on the rear face of a wafer, a fixing step of fixing the semi-cured adhesive layer of the wafer on a ring frame with a cohesive sheet, a dicing step of dicing the wafer into semiconductor chips, a UV-irradiating step of irradiating ultraviolet ray, and a pick-up step of picking up the chips and semi-cured adhesive layers from the cohesive layer, wherein the cohesive sheet has a cohesive layer of a cohesive agent having a particular composition formed on one face of its base film.

4 Claims, No Drawings

METHOD FOR MANUFACTURING ELECTRONIC COMPONENT

TECHNICAL FIELD

The present invention relates to a method for manufacturing electronic component.

BACKGROUND ART

One method for manufacturing an electronic component is a manufacturing method comprising a bonding step of bonding electronic component composites carrying multiple circuit patterns formed on a wafer or an insulating substrate onto a cohesive sheet, a dicing step of dicing the silicon wafer with a dicing blade into semiconductor chips, a pick-up step of picking up the cut chips from the cohesive sheet by irradiation with UV ray form the cohesive sheet side, and a fixing step of applying an adhesive agent on the bottom face of the picked-up chips and fixing the chips for example on a lead frame with the adhesive agent.

Patent Documents 1 and 2 disclose a cohesive sheet having a function as a cohesive sheet for dicing, as it is laminated with a semi-cured adhesive layer, and also a function as an adhesive agent for fixing the semiconductor chips to a lead frame.

There is also a manufacturing method in which the adhesive agent-coating step after dicing is eliminated, as a semi-cured adhesive layer is formed on a semiconductor wafer by application of a pasty adhesive and the semi-cured into the sheet shape by UV irradiation or heating.

CITATION LIST

Patent Documents

[Patent Document 1] JP-A No. 2006-049509
[Patent Document 2] JP-A No. 2007-246633

SUMMARY OF THE INVENTION

Technical Problem

However, along with increase of the density of semiconductor elements, the chip size is decreasing significantly, often making it difficult to pick up chips after dicing. In addition, because the semiconductor wafer as well as the semi-cured adhesive layer and the cohesive layer of the cohesive sheet are diced during dicing, there are both the semi-cured adhesive layer and the cohesive layer copresent on the dicing line, making the pick up of the chips more difficult during the pick up operation and thus causing pickup troubles, even if the adhesive power is reduced sufficiently by UV irradiation after dicing.

An object of the present invention is to provide a method for producing an electronic component superior in semiconductor chip-holding efficiency, pickup efficiency, and contamination resistance in a well-balanced manner.

Solution to Problem

The present invention provides a method for manufacturing an electronic component, comprising a semi-cured adhesive layer-forming step of forming a semi-cured adhesive layer by coating a pasty adhesive on the rear face of a wafer and curing the pasty adhesive partially by UV irradiation or heating into the sheet shape;

a fixing step of fixing the semi-cured adhesive layer of the wafer on a ring frame by bonding them to a cohesive sheet;
a dicing step of dicing the wafer into semiconductor chips with a dicing blade;
a UV-irradiating step of irradiating ultraviolet ray; and
a pick-up step of picking up the chips and semi-cured adhesive layers from the cohesive layer, wherein:
the cohesive sheet has a base film and a cohesive layer formed on one face of the base film;
the cohesive constituting the cohesive layer contains 100 parts by mass of a (meth)acrylate ester copolymer (A), 5 to 200 parts by mass of a ultraviolet polymerizable compound (B), 0.5 to 20 parts by mass of a multifunctional isocyanate curing agent (C), 0.1 to 20 parts by mass of a photopolymerization initiator (D) and 0.1 to 20 parts by mass of a silicone polymer (E);
the (meth)acrylate ester copolymer (A) is a copolymer of (meth)acrylate ester monomers or a copolymer of a (meth)acrylate ester monomer and a vinyl compound monomer, wherein neither the (meth)acrylate ester monomer nor the vinyl compound monomer contains any hydroxyl group;
The ultraviolet polymerizable compound (B) contains a urethane acrylate oligomer (B1) and a multifunctional (meth)acrylate (B2);
the urethane acrylate oligomer (B1) has a weight-average molecular weight of 50000 or more, a polydiversity Mw/Mn, ratio of weight-average molecular weight Mw to number-average molecular weight Mn, of 5 or more, and a vinyl group number of 10 or more;
the photopolymerization initiator (D) has one or more hydroxyl groups; and the silicone polymer (E) has hydroxyl groups.

It is possible in such a configuration of the method for manufacturing an electronic component to improve semiconductor chip-holding efficiency, pickup efficiency, and contamination resistance in a well-balanced manner.

Preferably in the present invention, the urethane acrylate oligomer (B1) is prepared in reaction of trimeric isophorone diisocyanate with hydroxyl group-containing acrylates containing dipentaerythritol pentaacrylate as the major component and the multifunctional (meth)acrylate (B2) is dipentaerythritol hexaacrylate. It is thus possible to obtain an advantageous effect that it is possible to reduce the adhesiveness between the cohesive sheet and the semi-cured adhesive layer after ultraviolet irradiation and carry out the step of picking up chips and semi-cured adhesive layers from the cohesive layer more reliably.

Preferably in the present invention, the composition for the semi-cured adhesive layer contains at least one or both of an epoxy resin and a (meth)acrylate ester. It is thus possible to obtain an advantageous effect that it is possible to reduce the adhesiveness between the cohesive sheet and the semi-cured adhesive layer after ultraviolet irradiation and carry out the step of picking up chips and semi-cured adhesive layers from the cohesive layer more reliably.

Advantageous Effects of the Invention

The present invention relates to a method for producing an electronic component by using a cohesive sheet that is superior in semiconductor chip-holding efficiency, pickup efficiency and contamination resistance in a well-balanced manner.

DESCRIPTION OF EMBODIMENTS

Hereinafter, favorable embodiments of the method for manufacturing an electronic component according to the present invention will be described in detail.

<Definition of Terms>

The monomer unit, as used herein, means a structural unit derived from monomer. "Part" and "%" are values by mass. (Meth)acrylate is a generic term indicating both acrylate and methacrylate. (Meth)-including compounds such as (meth) acrylic acid are also generic terms indicating both a "meth"-including compound and a "meth"-free compound.

<Method for Manufacturing Electronic Component>

An electronic component is produced in:
(1) a semi-cured adhesive layer-forming step of forming a semi-cured adhesive layer by coating a pasty adhesive on the rear face of a wafer and curing the pasty adhesive partially by UV irradiation or heating into the sheet shape;
(2) a fixing step of fixing the semi-cured adhesive layer of the wafer on a ring frame by bonding them to the cohesive layer of a cohesive sheet;
(3) a dicing step of dicing the wafer into semiconductor chips with a dicing blade;
(4) a UV-irradiating step of irradiating ultraviolet ray; and
(5) a pick-up step of picking up the chips and semi-cured adhesive layers from the cohesive layer.

<Semi-cured Adhesive Layer-forming Step>

The methods of coating a pasty adhesive on the rear face of a wafer include gravure coating, comma coating, bar coating, knife coating, roll coating, letterpress printing, intaglio printing, lithographic printing, flexographic printing, offset printing, screen printing, spraying, and spin coating.

The method of forming a semi-cured adhesive layer by curing the pasty adhesive partially into the sheet shaped is UV irradiation or heating and the ultraviolet ray sources include black lights, low-pressure mercury lamps, high-pressure mercury lamps, ultrahigh-pressure mercury lamps, metal halide lamps, and excimer lamps. The amount of ultraviolet irradiation is preferably 100 mJ/cm$^2$ or more and less than 50 00 mJ/cm$^2$, because excessively weak irradiation leads to insufficient curing of the pasty adhesive and deterioration in pickup efficiency, while excessively strong irradiation leads to elongation of the exposure period and thus deterioration in productivity.

When the semi-cured adhesive layer is formed by heating, the heating temperature is preferably 60° C. or higher and lower than 250° C., because excessively lower temperature leads to insufficient curing of the pasty adhesive and deterioration in pickup efficiency, while excessively higher temperature leads to excessive curing of the adhesive and deterioration of the adhesive strength. The heating time is preferably 10 seconds or more and less than 30 minutes.

<Fixing Step>

The fixing step is a step of fixing the semi-cured adhesive layer of the wafer to a ring frame with the cohesive layer of a cohesive sheet and it is generally carried out in a tape-mounting device equipped with a roller.

<Dicing Step>

The dicing step is a step of dicing the silicon wafers carrying the semi-cured adhesive layer formed thereon into semiconductor chips, by rotating a dicing blade containing diamond polishing powders at high speed in a dicing apparatus.

<UV-irradiating Step>

In the UV-irradiating step, the adhesive power between the cohesive layer and the semi-cured adhesive layer is reduced by irradiation with ultraviolet ray onto the cohesive layer of the cohesive sheet.

The amount of the UV irradiation may be identical with that for the semi-cured adhesive layer-forming step described above.

<Pickup Step>

The pick-up step is a step of separating the semiconductor chips and the semi-cured adhesive layers from the cohesive layer. The semiconductor chips and the semi-cured adhesive layers are separated from the cohesive layer generally in a pickup machine or a die bonding machine.

<Cohesive Agent>

The cohesive agent constituting the cohesive layer contains a (meth)acrylate ester copolymer (A), a ultraviolet polymerizable compound (B), a multifunctional isocyanate curing agent (C), a photopolymerization initiator (D), and a silicone polymer (E). The (meth)acrylate ester copolymer (A) is a copolymer of (meth)acrylate ester monomers or a copolymer of a (meth)acrylate ester monomer and a vinyl compound monomer, wherein neither the (meth)acrylate ester monomer nor the vinyl compound monomer has a hydroxyl group therein. The ultraviolet polymerizable compound (B) consists of a urethane acrylate oligomer (B1) and a multifunctional (meth)acrylate (B2), wherein the urethane acrylate oligomer (B1) has a weight-average molecular weight of 50000 or more and a polydiversity Mw/Mn, ratio of the weight-average molecular weight Mw to number-average molecular weight Mn, of 5 or more, and has 10 or more vinyl groups. The photopolymerization initiator (D) has one or more hydroxyl groups. The silicone polymer (E) has hydroxyl groups.

[(Meth)Acrylate Ester Copolymer (A)]

The (meth)acrylate ester copolymer used in the present invention is a copolymer of (meth)acrylate ester monomers or a copolymer of a (meth)acrylate ester or a vinyl compound monomer and the monomers above do not have any hydroxyl group.

Examples of the (meth)acrylate ester monomers include butyl (meth)acrylate, 2-butyl (meth)acrylate, t-butyl (meth) acrylate, pentyl (meth)acrylate, octyl (meth)acrylate, 2-ethylhexyl (meth)acrylate, nonyl (meth)acrylate, decyl (meth) acrylate, lauryl (meth)acrylate, methyl (meth)acrylate, ethyl (meth)acrylate, isopropyl (meth)acrylate, tridecyl (meth) acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, and ethoxy-n-propyl (meth)acrylate.

The vinyl compound monomers are monomers having one or more functional groups selected from carboxyl, epoxy, amide, amino, methylol, sulfonic acid, sulfamic acid and phosphate/phosphite ester groups.

The carboxyl group-containing monomers include (meth) acrylic acid, crotonic acid, maleic acid, maleic anhydride, itaconic acid, fumaric acid, acrylamide-N-glycolic acid, cinnamic acid and the like.

The epoxy group-containing monomers include allyl glycidyl ether and (meth)acrylate glycidyl ether.

The amide group-containing monomers include (meth) acrylamide. Alternatively, the amino group-containing monomers include N,N-dimethyl aminoethyl (meth)acrylate. The methylol group-containing monomers include N-methylol acrylamide.

The (meth)acrylate ester copolymers are produced for example by emulsion polymerization or solution polymerization. Acrylic rubbers produced by emulsion polymerization are preferable to make the cohesive sheet easily separated from the semi-cured adhesive layer by interaction therewith after UV irradiation and to assure high semiconductor chip pickup efficiency.

[Ultraviolet Polymerizable Compound (B)]

The ultraviolet polymerizable compounds (B) is the mixture of a urethane acrylate oligomer (B1) and a multifunctional (meth)acrylate (B2). The urethane acrylate oligomer (B1) is an oligomer having 10 or more vinyl groups and having a weight-average molecular weight of 50000 or more and a polydispersity Mw/Mn, ratio of weight-average molecular weight Mw to number-average molecular weight Mn, of 5 or more.

[Urethane Acrylate Oligomer (B1)]

The urethane acrylate oligomers (B1) include (1) those obtained in reaction of a (meth)acrylate compound having a hydroxyl group and multiple (meth)acrylate groups with a compound having multiple isocyanate groups (e.g., diisocyanate compound) and (2) those obtained in reaction of an oligomer having multiple isocyanate terminals that is prepared in reaction of a polyol oligomer having multiple terminal hydroxyl groups and an excess amount of a compound having multiple isocyanate groups (e.g., diisocyanate compound) with a (meth)acrylate compound having a hydroxyl group and multiple (meth)acrylate groups.

When the urethane acrylate oligomer has 10 or more vinyl groups, the cohesive sheet can be separated from the semi-cured adhesive layer easily after ultraviolet irradiation, assuring high pickup efficiency of semiconductor chips.

Preferably for reduction of the adhesiveness to the semi-cured adhesive layer and for easier separation of the cohesive sheet from the semi-cured adhesive layer after UV irradiation, a polyol oligomer is used and the urethane acrylate oligomer has 10 or more vinyl groups and has a weight-average molecular weight of 50000 or more and a polydiversity Mw/Mn, ratio of weight-average molecular weight Mw to number-average molecular weight Mn, of 5 or more.

[(Meth)Acrylate Compound Having a Hydroxyl Group and Multiple (Meth)Acrylate Groups]

The (meth)acrylate compounds having a hydroxyl group and multiple (meth)acrylate groups include hydroxypropylated trimethylolpropane triacrylate, pentaerythritol triacrylate, dipentaerythritol-hydroxy pentaacrylate, bis(pentaerythritol) tetraacrylate, tetramethylol methane triacrylate, glycidol diacrylate, and those compounds above in which part or all of the acrylate groups are replaced with methacrylate groups.

[Isocyanate Having Multiple Isocyanate Groups]

The isocyanates having multiple isocyanate groups include aromatic isocyanates, alicyclic isocyanates, and aliphatic isocyanates. Among the isocyanates above, alicyclic and aliphatic isocyanates having multiple isocyanate groups are preferable. The shape of the isocyanate component may be monomer, dimer or trimer, but trimer is preferable.

The aromatic diisocyanates include tolylene diisocyanate, 4,4-diphenylmethane diisocyanate, xylylene diisocyanate.

The alicyclic diisocyanates include isophorone diisocyanate, methylene bis(4-cyclohexylisocyanate).

The aliphatic diisocyanates include hexamethylene diisocyanate and trimethylhexamethylene diisocyanate.

[Polyol Oligomer Having Multiple Terminal Hydroxyl Groups]

The polyol components for the polyol oligomers having multiple terminal hydroxyl groups include poly(propylene oxide) diol, poly(propylene oxide) triol, copoly(ethylene oxide-propylene oxide) diol, poly(tetramethylene oxide) diol, ethoxylated bisphenol A, ethoxylated bisphenol S spiroglycol, caprolactone-modified diols, and carbonate diols.

[Multifunctional (Meth)Acrylate (B2)]

The multifunctional (meth)acrylates (B2) include trimethylolpropane triacrylate, hydroxypropylated trimethylolpropane triacrylate, pentaerythritol triacrylate, pentaerythritol tetraacrylate, pentaerythritol triacrylate, pentaerythritol-ethoxy tetraacrylate, dipentaerythritol-hydroxy pentaacrylate, dipentaerythritol hexaacrylate, bis(pentaerythritol) tetraacrylate, tetramethylolmethane triacrylate, glycidol diacrylate, and those in which part or all of the acrylate groups are replaced with methacrylate groups.

The amount of the ultraviolet polymerizable compound (B) blended is preferably 5 parts or more by mass and 200 parts or less by mass with respect to 100 parts by mass of the (meth)acrylate ester copolymer, because an excessive smaller amount leads to excessive increase of adhesive power causing pick up troubles, while an excessively larger amount leads to deterioration of adhesive power, which in turn leads deterioration of the holding efficiency of semiconductor chips during dicing.

The blending ratio B1:B2 of the urethane acrylate oligomer (B1) to the multifunctional (meth)acrylate (B2) is preferably 75:25 to 45:55, for reduction of the adhesiveness between the cohesive sheet and the semi-cured adhesive layer after ultraviolet irradiation and for stabilization of the step of picking up the chips and the semi-cured adhesive layers from the cohesive layer.

For reduction of the adhesiveness between the cohesive sheet and the semi-cured adhesive layer after ultraviolet irradiation and for stabilization of the step of picking up the chips and the semi-cured adhesive layers from the cohesive layer, the urethane acrylate oligomer (B1) is preferably a compound prepared in reaction of trimeric isophorone diisocyanate with hydroxyl group-containing acrylates containing dipentaerythritol pentaacrylate as the major component, and the multifunctional (meth)acrylate (B2) is more preferably dipentaerythritol hexaacrylate.

[Multifunctional Isocyanate Curing Agent (C)]

The multifunctional isocyanate curing agent is a compound having two or more isocyanate groups and examples thereof include aromatic polyisocyanates, aliphatic polyisocyanates and cycloaliphatic polyisocyanates.

The aromatic polyisocyanates include 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanatotoluene, 1,3,5-triisocyanatobenzene, dianisidine diisocyanate, 4,4'-diphenylether diisocyanate, 4,4',4''-triphenylmethane triisocyanate, ω,ω'-diisocyanato-1,3-dimethylbenzene, ω,ω'-diisocyanato-1,4-dimethylbenzene, ω,ω'-diisocyanato-1,4-diethylbenzene, 1,4-tetramethylxylylene diisocyanate, and 1,3-tetramethylxylylene diisocyanate.

The aliphatic polyisocyanates include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate and 2,4,4-trimethylhexamethylene diisocyanate.

The alicyclic polyisocyanates include 3-isocyanatomethyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bis(cyclohexyl isocyanate), and 1,4-bis(isocyanatomethyl)cyclohexane.

Among the polyisocyanates described above, 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, and hexamethylene diisocyanate are preferable.

The blending rate of the multifunctional isocyanate curing agent (C) is preferably 0.5 part or more by mass and 20 parts or less by mass (more preferable lower limit is 1.0 part by mass and more preferable upper limit is 10 parts by mass) with respect to 100 parts by mass of the (meth)acrylate ester copolymer, because an excessively lower blending rate causes lower reduction of the adhesive power and thus leads to pickup troubles, while an excessively higher blending rate leads to deterioration of the adhesive power and deterioration of the holding efficiency of the semiconductor chip during dicing.

[Photopolymerization Initiator (D)]

The photopolymerization initiator (D) has at least one hydroxyl group. The photopolymerization initiators having a hydroxyl group include 2-hydroxy-methyl-1-phenyl-propan-1-one (product name: Darocur 1173, produced by Ciba Japan) and 1-hydroxycyclohexyl phenyl ketone (product name: Irgacure 184, produced by Ciba Japan), while the photopolymerization initiators having two or more hydroxyl groups include 1-[4-(hydroxyethoxy)-phenyl]-2-hydroxy-2-methyl-1-propan-1-one (product name: Irgacure 2959, produced by Ciba Japan), and 2-hydroxy-1-{4-[4-(2-hydroxy-2-methyl-propionyl)-benzyl]-phenyl}-2-methyl-propan-1-one (product name: Irgacure 127, produced by Ciba Japan).

The number of the hydroxyl groups in the hydroxyl group-containing photopolymerization initiator (D) is preferably two or more. When the photopolymerization initiator has two or more hydroxyl groups, the cleavage products from the photoinitiator after UV irradiation can be trapped with the acryloyl group of the (meth)acrylate ester monomer (A), thus suppressing migration thereof into the semi-cured adhesive layer.

The blending rate of the photopolymerization initiator (D) is preferably 0.1 part or more by mass and 20 part or less by mass with respect to 100 parts by mass of the (meth)acrylate ester polymer, because an excessively lower blending rate prohibits reduction of the adhesive power after photopolymerization, while an excessively higher blending rate leads to excessive drop of the adhesive power after photopolymerization.

[Silicone Polymer (E)]

The silicone polymer is preferably a copolymer of a (meth)acrylic monomer and a silicone-based macromonomer having vinyl groups at the terminals of the polydimethylsiloxane bonds, which contains the monomer units derived from the monomer having vinyl groups at the terminals of the polydimethylsiloxane bonds, and specifically, it is a homopolymer of silicone-based macromonomers or a vinyl polymer prepared by polymerization of a silicone-based macromonomer and another vinyl compound. The silicone-based macromonomer is preferably a compound having a vinyl group such as (meth)acryloyl or styryl at the terminals of the polydimethylsiloxane bonds.

The silicone polymer is preferably a silicone polymer having at least reactive hydroxy alkyl (meth)acrylates, modified hydroxy (meth)acrylates or vinyl groups, because it is possible to prevent generation of adhesive residues called particles after pick up of semiconductor chips and to prevent migration of the silicone polymer into the semi-cured adhesive layer even after the cohesive sheet and the semi-cured adhesive layer are bonded to each other.

The (meth)acrylic monomer as a raw material for the silicone polymer is, for example, an alkyl (meth)acrylate, a hydroxyalkyl (meth)acrylate, a modified hydroxy (meth)acrylate, and (meth)acrylic acid.

The alkyl (meth)acrylates include methyl (meth)acrylate, ethyl (meth)acrylate, n-propyl (meth)acrylate, n-butyl (meth)acrylate, isobutyl (meth)acrylate, t-butyl (meth)acrylate, 2-ethylhexyl (meth)acrylate, lauryl (meth)acrylate, stearyl (meth)acrylate, isobornyl (meth)acrylate, and hydroxy alkyl (meth)acrylates.

The hydroxyalkyl (meth)acrylates include hydroxyethyl (meth)acrylate, hydroxypropyl (meth)acrylate, and hydroxybutyl (meth)acrylate.

The modified hydroxy (meth)acrylates include ethylene oxide-modified hydroxy (meth)acrylates and lactone-modified hydroxy (meth)acrylates.

The blending amount of the silicone polymer is preferably 0.1 part or more by mass and 20 parts or less by mass with respect to 100 parts by mass of the (meth)acrylate ester polymer, because an excessively lower amount makes it difficult to separate the cohesive sheet from the semi-cured adhesive layer after UV irradiation, while an excessively higher amount makes it difficult to suppress reduction of the initial adhesive power.

The rate of the silicone-based macromonomer unit in the silicone polymer is preferably 15 parts or more by mass and 50 parts or less by mass in 100 parts by mass of the silicone polymer, because an excessively lower rate makes it difficult to separate the cohesive sheet from the semi-cured adhesive layer after UV irradiation, while an excessively higher rate prohibits suppression of contamination of the adhesive surface by bleeding out.

Additives such as softening agents, aging inhibitors, fillers, ultraviolet absorbents and photostabilizers may be added to the adhesive in the range that does not affect other raw materials.

The thickness of the cohesive layer is preferably 3 μm or more and 100 μm or less, particularly preferably, 5 μm or more and 20 μm or less, because an excessively smaller thickness reduces the adhesive power, while an excessively larger thickness makes it difficult to separate the cohesive sheet from the semi-cured adhesive layer after UV irradiation and reduces the pickup efficiency of semiconductor chips.

<Base Film>

The base film for use in the present invention is, for example, made of polyvinyl chloride, polyethylene terephthalate, an ethylene-vinyl acetate copolymer, an ethylene-acrylic acid-acrylate ester film, an ethylene-ethyl acrylate copolymer, polyethylene, polypropylene, a propylene-based copolymer, an ethylene-acrylic acid copolymer, or an ionomer resin of an ethylene-(meth)acrylic acid copolymer or ethylene-(meth)acrylic acid-(meth)acrylate ester copolymer that is crosslinked with metal ions. The base film may be made of a mixture or a laminate of these resins.

The base film is preferably made of a propylene-based copolymer. It is possible by using a propylene-based copolymer to reduce the amount of the debris generated during semiconductor wafer dicing. The propylene-based copolymer is, for example, a random, block or alternating copolymer of propylene with other components. Examples of the other components include α-olefins such as ethylene, 1-butene, 1-pentene, 1-hexene, and 1-heptene, copolymers of at least two or more α-olefins, styrene-diene copolymers and the like.

The propylene-based copolymer may be prepared, for example, by solution polymerization, bulk polymerization, gas-phase polymerization, stepwise polymerization or the like, but preferable is a stepwise polymerization in at least two stages, wherein a propylene homopolymer or a random copolymer of propylene with small amounts of ethylene and/or α-olefin is prepared in the first stage and an α-olefinic homopolymer or a random copolymer of propylene with small amounts of ethylene and/or α-olefin is prepared in the second and later stages.

The base film is preferably processed the antistatic treatment. It is possible by the antistatic treatment to prevent static electrification during separation of the semi-cured adhesive layer. Examples of the antistatic treatments include (1) those by blending an antistatic agent to the composition constituting the base film, (2) those by coating an antistatic agent on the semi-cured adhesive layer-sided surface of the base film, and (3) those by corona discharge. The antistatic agent is, for example, a quaternary amine salt monomer.

Examples of the quaternary amine salt monomers include quaternized dimethylaminoethyl (meth)acrylate chloride salts, quaternized diethylaminoethyl (meth)acrylate chloride salts, quaternized methylethylaminoethyl (meth)acrylate chloride salts, quaternized p-dimethylaminostyrene chloride salts, and quaternized p-diethylamino styrene chloride salts, and quaternized dimethylaminoethyl methacrylate chloride salts are preferable.

<Semi-cured Adhesive Layer>

The semi-cured adhesive layer is formed by coating a pasty adhesive on the entire or partial surface on the rear face, i.e., on the circuit-free face of a wafer for adhesion to a lead frame or a circuit board and curing it partially into the sheet shape by UV irradiation or heating.

The semi-cured adhesive layer composition preferably contains, as its component, an (meth)acrylate ester, polyamide, polyethylene, polysulfone, an epoxy resin, polyimide, polyamide acid, silicone resin, an phenol resin, a rubber, a fluorine rubber and a fluoroplastic or the mixture, copolymer and laminated film thereof. The composition preferably contains an epoxy resin and/or an (meth)acrylate ester from the point of reliability of the chip-chip adhesion. The composition may contain additionally photopolymerization initiators, thermal polymerization initiators, antistatic agents, crosslinking agents, crosslinking accelerators, fillers and the like.

The thickness of the semi-cured adhesive layer is preferably 3 μm or more and 100 μm, particularly preferably 5 μm or more and 20 μm or less, because an excessively smaller thickness leads to reduction of the adhesion reliability during fixation to the lead frame and possible separation between the lead frame and the semi-cured adhesive layer, while an excessively larger thickness leads to increase of machining resistance during dicing and thus possible damage to the chips and the semi-cured adhesive layers.

The semi-cured adhesive layer composition more preferably contains one or both of an epoxy resin and a (meth) acrylate ester for reduction of the machining resistance during dicing and prevention of the damage to the chips and the semi-cured adhesive layers.

<Cohesive Sheet>

The cohesive sheet according to the present invention is prepared by coating a cohesive agent on a base film.

The method for manufacturing an electronic component in this embodiment, which uses the cohesive sheet described above, is a method superior in semiconductor chip-holding characteristics, pickup efficiency, and contamination resistance.

EXAMPLES

Hereinafter, the method for manufacturing an electronic component according to the present invention will be described with reference to Examples and Comparative Examples.

Tables 1 and 2 show the compositions and the evaluation methods of the cohesive layers in the Examples and Comparative Examples of the method for producing an electronic component according to the present invention.

TABLE 1

| | | | | | Example | | | | | |
|---|---|---|---|---|---|---|---|---|---|---|
| | | | | | 1 | 2 | 3 | 4 | 5 | 6 |
| Cohesive layer | (Meth)acrylate ester copolymer (A) | | A-1 | | 100 | 100 | | 100 | 100 | 100 |
| | | | A-2 | | | | 100 | | | |
| | | | A-3 | | | | | | | |

| | | | Urethane acrylate oligomer (B1) | | | | | | | |
|---|---|---|---|---|---|---|---|---|---|---|
| | | | Weight-average molecular weight | Polydispersity | Number of vinyl groups | | | | | |
| | Ultraviolet polymerizable compound (B) | B-1 | 100000 | 10.7 | 15 | 50 | 50 | 50 | 5 | 200 | 50 |
| | | B-2 | 11000 | 1.2 | 15 | | | | | | |
| | | B-3 | 70000 | 1.2 | 15 | | | | | | |
| | | B-4 | 30000 | 7.5 | 15 | | | | | | |
| | | B-5 | 70000 | 8.2 | 6 | | | | | | |
| | Multifunctional isocyanate curing agent (C) | | C-1 | | | 5 | 5 | 5 | 5 | 5 | 0.5 |
| | Photo-polymerization initiator (D) | | D-1 | | | 2 | 2 | 2 | 0.8 | 8 | 2 |
| | | | D-2 | | | | | | | | |
| | | | D-3 | | | | | | | | |
| | Silicone polymer (E) | | E-1 | | | 1.5 | 1.5 | 1.5 | 1.5 | 1.5 | 1.5 |
| | | | E-2 | | | | | | | | |
| Evaluation | | | Chip-holding efficiency | | | ◎ | ◎ | ◎ | ◎ | ◎ | ◎ |
| | | | Pickup efficiency | | | ◎ | ○ | ○ | ◎ | ◎ | ○ |
| | | | Contamination resistance | | | ◎ | ◎ | ◎ | ◎ | ◎ | ○ |
| | | | Overall | | | ◎ | ○ | ○ | ◎ | ◎ | ○ |

TABLE 1-continued

|  |  |  | Example | | | | | |
|---|---|---|---|---|---|---|---|---|
|  |  |  | 7 | 8 | 9 | 10 | 11 | 12 |
| Cohesive layer | (Meth)acrylate ester copolymer (A) | A-1 | 100 | 100 | 100 | 100 | 100 | 100 |
|  |  | A-2 | | | | | | |
|  |  | A-3 | | | | | | |

| | | Urethane acrylate oligomer (B1) | | | | | | | | |
|---|---|---|---|---|---|---|---|---|---|---|
| | | | Weight-average molecular weight | Polydispersity | Number of vinyl groups | | | | | |
| | Ultraviolet polymerizable compound (B) | B-1 | 100000 | 10.7 | 15 | 50 | 50 | 50 | 50 | 50 | 50 |
| | | B-2 | 11000 | 1.2 | 15 | | | | | | |
| | | B-3 | 70000 | 1.2 | 15 | | | | | | |
| | | B-4 | 30000 | 7.5 | 15 | | | | | | |
| | | B-5 | 70000 | 8.2 | 6 | | | | | | |
| | Multifunctional isocyanate curing agent (C) | C-1 | | | | 20 | 5 | 5 | 5 | 5 | 5 |
| | Photo-polymerization initiator (D) | D-1 | | | | 2 | 0.1 | 20 | | 2 | 2 |
| | | D-2 | | | | | | | 2 | | |
| | | D-3 | | | | | | | | | |
| | Silicone polymer (E) | E-1 | | | | 1.5 | 1.5 | 1.5 | 1.5 | 0.1 | 20 |
| | | E-2 | | | | | | | | | |
| Evaluation | | Chip-holding efficiency | | | | ○ | ⊚ | ⊚ | ⊚ | ⊚ | ⊚ |
| | | Pickup efficiency | | | | ⊚ | ⊚ | ⊚ | ⊚ | ⊚ | ⊚ |
| | | Contamination resistance | | | | ○ | ⊚ | ⊚ | ○ | ⊚ | ⊚ |
| | | Overall | | | | ○ | ⊚ | ⊚ | ○ | ⊚ | ⊚ |

TABLE 2

|  |  |  | Comparative example | | | | | | | |
|---|---|---|---|---|---|---|---|---|---|---|
|  |  |  | 1 | 2 | 3 | 4 | 5 | 6 | 7 | 8 |
| Cohesive layer | (Meth)acrylate ester copolymer (A) | A-1 | | 100 | 100 | 100 | 100 | 100 | 100 | 100 |
|  |  | A-2 | | | | | | | | |
|  |  | A-3 | 100 | | | | | | | |

| | | Urethane acrylate oligomer (B1) | | | | | | | | | |
|---|---|---|---|---|---|---|---|---|---|---|---|
| | | | Weight-average molecular weight | Polydispersity | Number of vinyl groups | | | | | | |
| | Ultraviolet polymerizable compound (B) | B-1 | 100000 | 10.7 | 15 | 50 | 2.5 | 250 | | | | | 50 |
| | | B-2 | 11000 | 1.2 | 15 | | | | 50 | | | |
| | | B-3 | 70000 | 1.2 | 15 | | | | | 50 | | |
| | | B-4 | 30000 | 7.5 | 15 | | | | | | 50 | |
| | | B-5 | 70000 | 8.2 | 6 | | | | | | | 50 |
| | Multifunctional isocyanate curing agent (C) | C-1 | | | | 5 | 5 | 5 | 5 | 5 | 5 | 5 | 0.1 |
| | Photopolymerization initiator (D) | D-1 | | | | 2 | 0.4 | 10 | 2 | 2 | 2 | 2 | 2 |
| | | D-2 | | | | | | | | | | | |
| | | D-3 | | | | | | | | | | | |
| | Silicone polymer (E) | E-1 | | | | 1.5 | 1.5 | 1.5 | 1.5 | 1.5 | 1.5 | 1.5 | 1.5 |
| | | E-2 | | | | | | | | | | | |
| Evaluation | | Chip-holding efficiency | | | | ⊚ | ○ | ⊚ | ⊚ | ⊚ | ⊚ | ○ | ⊚ |
| | | Pickup efficiency | | | | X | X | X | X | X | X | X | X |
| | | Contamination resistance | | | | ⊚ | ⊚ | X | ⊚ | ⊚ | ○ | ○ | X |
| | | Overall | | | | X | X | X | X | X | X | X | X |

|  |  |  | Comparative example | | | | | | |
|---|---|---|---|---|---|---|---|---|---|
|  |  |  | 9 | 10 | 11 | 12 | 13 | 14 | 15 |
| Cohesive layer | (Meth)acrylate ester copolymer (A) | A-1 | 100 | 100 | 100 | 100 | 100 | 100 | 100 |
|  |  | A-2 | | | | | | | |
|  |  | A-3 | | | | | | | |

TABLE 2-continued

| | | Urethane acrylate oligomer (B1) | | | | | | | | |
|---|---|---|---|---|---|---|---|---|---|---|
| | | Weight-average molecular weight | Polydispersity | Number of vinyl groups | | | | | | |
| Ultraviolet polymerizable compound (B) | B-1 | 100000 | 10.7 | 15 | 50 | 50 | 50 | 50 | 50 | 50 | 50 |
| | B-2 | 11000 | 1.2 | 15 | | | | | | | |
| | B-3 | 70000 | 1.2 | 15 | | | | | | | |
| | B-4 | 30000 | 7.5 | 15 | | | | | | | |
| | B-5 | 70000 | 8.2 | 6 | | | | | | | |
| Multifunctional isocyanate curing agent (C) | | C-1 | | | 25 | 5 | 5 | 5 | 5 | 5 | 5 |
| Photopolymerization initiator (D) | | D-1 | | | 2 | 0.01 | 25 | | 2 | 2 | 2 |
| | | D-2 | | | | | | | | | |
| | | D-3 | | | | | | 2 | | | |
| Silicone polymer (E) | | E-1 | | | 1.5 | 1.5 | 1.5 | 1.5 | 0.01 | 25 | |
| | | E-2 | | | | | | | | | 1.5 |
| Evaluation | | Chip-holding efficiency | | | X | ◎ | ○ | ◎ | ◎ | X | ○ |
| | | Pickup efficiency | | | ◎ | X | ◎ | ◎ | X | ◎ | ○ |
| | | Contamination resistance | | | ◎ | ◎ | X | X | ◎ | X | X |
| | | Overall | | | X | X | X | X | X | X | X |

<Method for Manufacturing Electronic Component>

(1) A pasty adhesive agent containing epoxy and acrylate ester resins as major components was coated on the entire rear face of a silicon wafer having a diameter of 8 inches and a thickness of 0.1 mm and carrying a dummy circuit pattern formed by screen printing. Irradiation with ultraviolet ray at an irradiation intensity of 1000 mJ/cm$^2$ gave a sheet-shaped semi-cured adhesive layer having a thickness of 30 μm.

(2) The semi-cured adhesive layer formed on the rear face of a silicon wafer and a ring frame were fixed, as a cohesive sheet is bonded thereto.

(3) The silicon wafer was diced into semiconductor chips with a size of 9 mm×9 mm with a dicing blade. Major settings during the dicing were as follows:

Cut depth into cohesive sheet: 15 μm
Dicing apparatus: DAD341, produced by DISCO Corporation
Dicing blade: NBC-ZH2050-27HEEE produced by DISCO Corporation
Shape of dicing blade: external diameter: 55.56 mm, blade width: 35 μm,
internal diameter: 19.05 mm
Dicing blade rotational frequency: 40,000 rpm
Dicing blade feed velocity: 50 mm/second
Machining water temperature: 25° C.
Amount of machining water: 1.0 liter/minute (4) After irradiation with ultraviolet ray from a high-pressure mercury lamp at an intensity of 150 mJ/cm$^2$, the semiconductor chips and the semi-cured adhesive layers were picked up from the cohesive layer. Major settings during the pick up were as follows:

Pick up machine: CAP-300II, produced by Canon Machinery Inc.
Shape of needle pin: 250 μmR
Needle pin push-up height: 0.5 mm
Expansion: 8 mm

[Cohesive Sheet]

Each of the cohesives in the compositions of Examples and Comparative Examples was coated on a polyethylene terephthalate separator film to a cohesive layer thickness of 10 μm after drying. The cohesive layer was formed on the base film and the laminate was aged at 40° C. for 7 days, to give a cohesive sheet.

Although not described in Tables 1 and 2, the base film used in Examples and Comparative Examples was a film of a propylene-based copolymer produced by SunAllomer Ltd. (product number: X500F, MFR (melt flow rate): 7.5 g/10 minutes, density: 0.89 g/cm$^3$, thickness: 80 μm).

The cohesive layer was prepared with a blend at the blending rate shown in Table 1 or 2. The numbers in the table are parts by mass. Hereinafter, the content in Tables 1 and 2 will be described more specifically.

<Adhesive>

[(Meth)Acrylate Ester Copolymers (A)]

A-1: Acrylic rubber AR53L from Zeon Corp.; a copolymer of ethyl acrylate (40%), butyl acrylate (23%) and methoxyethyl acrylate (37%), which was produced by emulsion polymerization. None of the compounds contain a hydroxyl group.

A-2: Proprietary polymer; a copolymer of ethyl acrylate (40%), butyl acrylate (22%), methoxyethyl acrylate (37%) and acrylic acid (1%), which was produced by emulsion polymerization. None of the compounds contain a hydroxyl group.

A-3: SK Dyne 1435 from Soken Chemical & Engineering Co., Ltd.; a copolymer of butyl acrylate (67%), methyl acrylate (28%) and 2-hydroxyethyl acrylate (5%), which was produced by solution polymerization. 2-Hydroxyethyl acrylate contains a hydroxyl group.

[Ultraviolet Polymerizable Compounds (B)]

B-1: UN-905 from Negami Chemical Industrial Co., Ltd.; The ultraviolet polymerizable compound B-1 contains a urethane acrylate oligomer (B1) and multifunctional (meth)acrylates (B2). The urethane acrylate oligomer (B1) was prepared in reaction of trimeric isophorone diisocyanate with hydroxyl group-containing acrylates containing dipentaerythritol pentaacrylate as the major component, while the multifunctional (meth)acrylates (B2) contain dipentaerythritol hexaacrylate as the major component.

The rate of the urethane acrylate oligomer (B1) is 75% and that of the multifunctional (meth)acrylates (B2) 25%. The urethane acrylate oligomer (B1) has a weight-average molecular weight of 100000, a polydispersity of 10.7, and a vinyl group number of 15.

B-2, UN-3320HS from Negami Chemical Industrial Co., Ltd.; The ultraviolet polymerizable compound B-2 contains a urethane acrylate oligomer (B1) and multifunctional (meth)acrylates (B2). The urethane acrylate oligomer (B1) was prepared in reaction of trimeric isophorone diisocyanate with hydroxyl group-containing acrylates containing dipentaerythritol pentaacrylate as the major component, while the multifunctional (meth)acrylates (B2) contain dipentaerythritol hexaacrylate as the major component. The rate of the urethane acrylate oligomer (B1) is 45% and that of the multifunctional (meth)acrylates (B2) 55%. The urethane acrylate oligomer (B-2) has a weight-average molecular weight of 11000, a polydispersity of 1.2, and a vinyl group number of 15.

B-3: Proprietary polymer A; The ultraviolet polymerizable compound B-3 contains a urethane acrylate oligomer (B1) and multifunctional (meth)acrylates (B2). The urethane acrylate oligomer (B1) was prepared in reaction of trimeric hexamethylene diisocyanate with hydroxyl group-containing acrylates containing dipentaerythritol pentaacrylate as the major component, while the multifunctional (meth) acrylates (B2) contain dipentaerythritol hexaacrylate as the major component. The rate of the urethane acrylate oligomer (B1) is 45% and that of the multifunctional (meth) acrylates (B2) 55%. The urethane acrylate oligomer (B1) has a weight-average molecular weight of 70000, a polydispersity of 1.2, and a vinyl group number of 15.

B-4: Proprietary polymer B; The ultraviolet polymerizable compound B-4 contains a urethane acrylate oligomer (B1) and multifunctional (meth)acrylates (B2). The urethane acrylate oligomer (B1) was prepared in reaction of trimeric hexamethylene diisocyanate with hydroxyl group-containing acrylates containing dipentaerythritol pentaacrylate as the major component, while the multifunctional (meth) acrylates (B2) contain dipentaerythritol hexaacrylate as the major component. The rate of the urethane acrylate oligomer (B1) is 45% and that of the multifunctional (meth) acrylates (B2) 55%. The urethane acrylate oligomer (B1) has a weight-average molecular weight of 30000, a polydispersity 7.5, and a vinyl group number of 15.

B-5, Proprietary polymer C; The ultraviolet polymerizable compound B-5 contains a urethane acrylate oligomer (B1) and multifunctional (meth)acrylates (B2). The urethane acrylate oligomer (B1) was prepared in reaction of trimeric hexamethylene diisocyanate with hydroxyl group-containing acrylates containing dipentaerythritol pentaacrylate as the major component, while the multifunctional (meth) acrylates (B2) contain pentaerythritol tetraacrylate as the major component. The rate of the urethane acrylate oligomer (B1) is 75% and that of the multifunctional (meth) acrylates (B2) 25%. The urethane acrylate oligomer (B1) has a weight-average molecular weight of 70000, a polydispersity of 8.2, and a vinyl group number of 6.

[Multifunctional Isocyanate Curing Agent (C)]

C-1: Coronate L-45E from Nippon Polyurethane Industry Co., Ltd.; trimethylolpropane adduct of 2,4-tolylene diisocyanate

[Photopolymerization Initiators (D)]

D-1: product name: Irgacure 127, produced by Ciba Japan; 2-hydroxy-1-{4-[4-(2-hydroxy-2-methyl-propionyl)-benzyl]-phenyl}-2-methyl-propan-1-one, which contains two hydroxyl groups.

D-2: product name: Irgacure 184 produced by Ciba Japan: 1-hydroxy-cyclohexyl-phenyl-ketone, having a hydroxyl group.

D-3: product name: Irgacure 651, produced by Ciba Japan; benzyl dimethyl ketal, having no hydroxyl group.

[Silicone Polymers (E)]

E-1: UTMM-LS2, produced by Soken Chemical & Engineering Co., Ltd.; a silicone-based graft copolymer containing silicone-based oligomer units having (meth)acryloyl groups at the terminals of the silicone chains and graft-polymerized with acrylic vinyl units for example of methyl methacrylate. The copolymer contains hydroxyl groups.

E-2: A commercially available silicone oil, having no hydroxyl group

The molecular weight of the urethane acrylate oligomer (B1) was determined under the following GPC measurement condition:

Apparatus: HLC-8120GPC (produced by Tosoh Corp.)
Column: 1 TSK Guard HZ-L column and 3 HZM-N columns placed in series
Temperature: 40° C.
Detector: differential refractometer
Solvent: tetrahydrofuran
Concentration: 0.2 mass/vol %
Calibration curve: drawn with standard polystyrene (PS) samples (produced by Varian Medical Systems, Inc.). The molecular weight is a value as PS.

<Evaluation Method>

The evaluation methods in Tables 1 and 2 will be described below.

<Chip-holding Efficiency>

The chip-holding efficiency was evaluated by determining the rate of the semiconductor chips that remained held by adhesive sheet after the dicing step.

⊚(favorable): chip flying rate: less than 5%
○(good): chip flying rate: 5% or more and less than 10%
x(unfavorable): chip flying rate: 10% or more <Pickup Efficiency>

The pick-up efficiency was evaluated by counting the rate of the chips that could be picked up in the pick-up step.

⊚ (favorable): pickup success rate: 95% or more
○ (good): pickup success rate: 80% or more and less than 95%
–(unfavorable): pickup success rate: less than 80%

<Contamination Resistance>

In determination of the contamination resistance, the adhesive face of the cohesive sheet was bonded to the semi-cured adhesive layer. After storage for 1 week, It was irradiated with ultraviolet ray from a high-pressure mercury lamp at an intensity of 500 mJ/cm$^2$. After storage additionally for 1 week or 4 weeks, the cohesive sheet was separated. The separated semi-cured adhesive layer was analyzed by GC-MS, and the peaks derived from the cohesive were measured.

⊚ (favorable): No peak derived from the cohesive was observed in the cohesive sheet-free semi-cured adhesive layer after storage both for 1 week and for 4 weeks from UV irradiation.

○ (good): No peak derived from the cohesive was observed in the cohesive sheet-free semi-cured adhesive layer after storage for 1 week from UV irradiation, and, peaks derived from the cohesive were observed in the cohesive sheet-free semi-cured adhesive layer after storage for 4 weeks from UV irradiation, x (unfavorable): peaks derived from the cohesive were observed in the cohesive sheet-free semi-cured adhesive layer after storage both for 1 week and for 4 weeks from UV irradiation.

As shown in Examples and Comparative Examples above, the method for producing an electronic component according to the present invention has characteristics in its favorable chip-holding efficiency, pickup efficiency and contamination resistance.

The invention claimed is:

1. A method for manufacturing an electronic component, comprising:
   (1) a semi-cured adhesive layer-forming step of forming a semi-cured adhesive layer by coating a pasty adhesive on the rear face of a wafer and curing the pasty adhesive partially by UV irradiation or heating into the sheet shape;
   (2) a fixing step of fixing the semi-cured adhesive layer of the wafer on a ring frame by bonding them to a cohesive sheet;
   (3) a dicing step of dicing the wafer into semiconductor chips with a dicing blade;
   (4) a UV-irradiating step of irradiating ultraviolet ray; and
   (5) a pick-up step of picking up the chips and semi-cured adhesive layers from the cohesive layer, wherein:
   the cohesive sheet has a base film and a cohesive layer formed on one face of the base film;
   the cohesive constituting the cohesive layer contains 100 parts by mass of a (meth)acrylate ester copolymer (A), 5 to 200 parts by mass of a ultraviolet polymerizable compound (B), 0.5 to 20 parts by mass of a multifunctional isocyanate curing agent (C), 0.1 to 20 parts by mass of a photopolymerization initiator (D), and 0.1 to 20 parts by mass of a silicone polymer (E);
   the (meth)acrylate ester copolymer (A) is a copolymer of (meth)acrylate ester monomers or a copolymer of a (meth)acrylate ester monomer and a vinyl compound monomer, wherein neither the (meth)acrylate ester monomer nor the vinyl compound monomer contain any hydroxyl group;
   the ultraviolet polymerizable compound (B) contains a urethane acrylate oligomer (B1) and multifunctional (meth)acrylates (B2);
   the urethane acrylate oligomer (B1) has a weight-average molecular weight of 50000 or more, a polydiversity Mw/Mn, ratio of weight-average molecular weight Mw to number-average molecular weight Mn, of 5 or more, and a vinyl group number of 10 or more;
   the photopolymerization initiator (D) has one or more hydroxyl groups; and
   the silicone polymer (E) has hydroxyl groups.

2. The method for manufacturing an electronic component according to claim 1, wherein:
   the urethane acrylate oligomer (B1) is prepared in reaction of trimeric isophorone diisocyanate with hydroxyl group-containing acrylates containing dipentaerythritol pentaacrylate as the major component; and
   the multifunctional (meth)acrylate (B2) is dipentaerythritol hexaacrylate.

3. The method for manufacturing an electronic component according to claim 1, wherein the composition for the semi-cured adhesive layer in the semi-cured adhesive layer-forming step contains one or both of an epoxy resin and a (meth)acrylate ester.

4. A cohesive sheet for production of an electronic component, which is used as bonded to a semi-cured adhesive layer formed on the rear face of a wafer, comprising a base film and a cohesive layer formed on one face of the base film, wherein:
   the cohesive constituting the cohesive layer contains 100 parts by mass of a (meth)acrylate ester copolymer (A), 5 to 200 parts by mass of a ultraviolet polymerizable compound (B), 0.5 to 20 parts by mass of a multifunctional isocyanate curing agent (C), 0.1 to 20 parts by mass of a photopolymerization initiator (D), and 0.1 to 20 parts by mass of a silicone polymer (E);
   the (meth)acrylate ester copolymer (A) is a copolymer of (meth)acrylate ester monomers or a copolymer of a (meth)acrylate ester monomer and a vinyl compound monomer, wherein neither the (meth)acrylate ester monomer nor the vinyl compound monomer contains any hydroxyl group;
   the ultraviolet polymerizable compound (B) contains a urethane acrylate oligomer (B1) and multifunctional (meth)acrylates (B2);
   the urethane acrylate oligomer (B1) has a weight-average molecular weight of 50000 or more, a polydiversity Mw/Mn, ratio of weight-average molecular weight Mw to number-average molecular weight Mn, of 5 or more, and a vinyl group number of 10 or more;
   the photopolymerization initiator (D) has one or more hydroxyl groups; and
   the silicone polymer (E) has hydroxyl groups.

* * * * *